(12) United States Patent
Abramov

(10) Patent No.: US 6,791,236 B1
(45) Date of Patent: Sep. 14, 2004

US006791236B1

(54) METHOD UTILIZING THE SAW VELOCITY DISPERSION EFFECT FOR WEIGHTING BY SHAPING THE ELECTRODE FINGERS OF A SAW INTERDIGITAL TRANSDUCER AND APPARATUS PRODUCED THEREBY

(76) Inventor: Yuri Abramov, Har Hatzofim St. 24/4, Holon (IL), 58492

( * ) Notice: Subject to any disclaimer, the term of this patent is extended or adjusted under 35 U.S.C. 154(b) by 360 days.

(21) Appl. No.: 09/685,718

(22) Filed: Oct. 11, 2000

(51) Int. Cl.$^7$ .................................................. H03H 9/25
(52) U.S. Cl. .............................. 310/313 B; 310/313 C
(58) Field of Search .................... 310/313 B, 313 C, 310/313 R

(56) References Cited

U.S. PATENT DOCUMENTS

| | | | |
|---|---|---|---|
| 4,160,219 A | * | 7/1979 | Kuny ......................... 333/151 |
| 4,162,465 A | | 7/1979 | Hunsinger |
| 4,600,905 A | | 7/1986 | Fredricksen |
| 4,635,008 A | | 1/1987 | Solie |
| 4,749,971 A | | 6/1988 | Solie |
| 4,767,198 A | | 8/1988 | Solie et al. |
| 4,866,325 A | * | 9/1989 | Kodama et al. ......... 310/313 B |
| 4,878,036 A | | 10/1989 | Yatsuda et al. |
| 4,908,542 A | | 3/1990 | Solie |
| 4,973,875 A | * | 11/1990 | Yatsuda ................... 310/313 D |
| 5,189,330 A | | 2/1993 | Niitsuma |
| 5,239,517 A | | 8/1993 | Mariani |
| 5,289,073 A | | 2/1994 | Mariani |
| 5,304,965 A | | 4/1994 | Manner |
| 5,485,051 A | * | 1/1996 | Tera et al. .............. 310/313 B |
| 5,767,608 A | | 6/1998 | Toda |
| 5,818,310 A | | 10/1998 | Solie |
| 5,831,492 A | | 11/1998 | Solie |
| 5,831,494 A | | 11/1998 | Solie |
| 6,023,122 A | | 2/2000 | Liu et al. |
| 6,031,315 A | | 2/2000 | Abbott |
| 6,057,630 A | * | 5/2000 | Yanagihara et al. ..... 310/313 B |

OTHER PUBLICATIONS

Dong–Pei Chen, et al., Analysis of Metal–Strip SAW Gratings and Transducers, Transactions On Sonics and Ultrasoncis, May 1985, pp. 395–408, vol. SU–32, IEEE, USA.

David P. Morgan, Surface Wave Devices For Signal Processing, Studies in Electrical and Electronic Engineering, 1985, pp. 132–144, Elsevier, US.

C.B. Saw et al., Improved Design Of Single–Phase Unidirectional Transducers For Low–Loss SAW Filters, Ultrasonics Symposium, 1987, pp. 169–172, IEEE, US.

D.P. Morgan et al., Low Loss Filters Using Group–Type SPUDT Transducers, Ultrasonics Symposium, 1990, pp. 31–35, IEEE, US.

P. M. Naraine, et al., Wide Band Linear Phase SAW Filters Using Apodized Slanted Finger Transducers, Ultrasonics Symposium, 1983, pp. 113–116, IEEE, US.

Michel Feldman, et al., Design Of Multistrip Arrays, 77 Ultrasonics Symposium Proceedings, pp. 686–690, IEEE.

* cited by examiner

Primary Examiner—Thomas M. Dougherty
(74) Attorney, Agent, or Firm—Edward Langer, Pat. Atty.; Shiboleth, Yisraeli, Robets, Zisman & Co.

(57) ABSTRACT

A transducer for a surface acoustic wave (SAW) device comprises a plurality of interdigitized electrode fingers, which change in width along their length. Preferred forms include shapes similar to paired curled brackets { }, paired reversed curled brackets } {, paired rounded brackets ( ) trapezoids, bells, and rhombus <>. Simultaneously, weighting by shape of the interdigitized electrode fingers is determined using of at least one of the following inventive mechanisms: the SAW velocity dispersion effect along the finger's length and the dispersion of the SAW reflection coefficient along the finger's length. Electrode fingers shaped in form of either paired brackets, rhombus, cascaded brackets or cascaded rhombuses are also utilized for SAW beam diffraction control by focussing of the SAW due to the SAW velocity dispersion effect along the fingers' lengths.

23 Claims, 17 Drawing Sheets

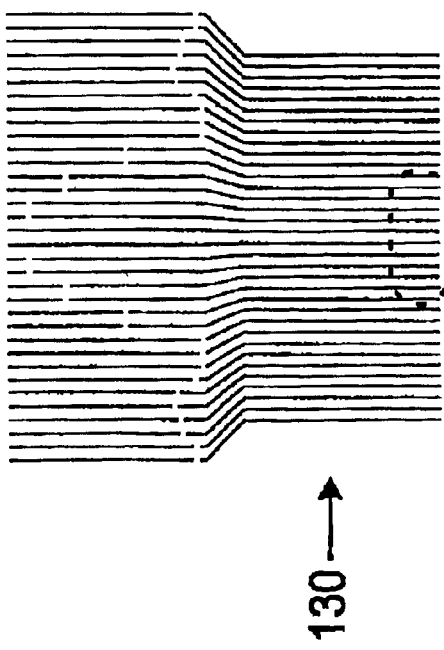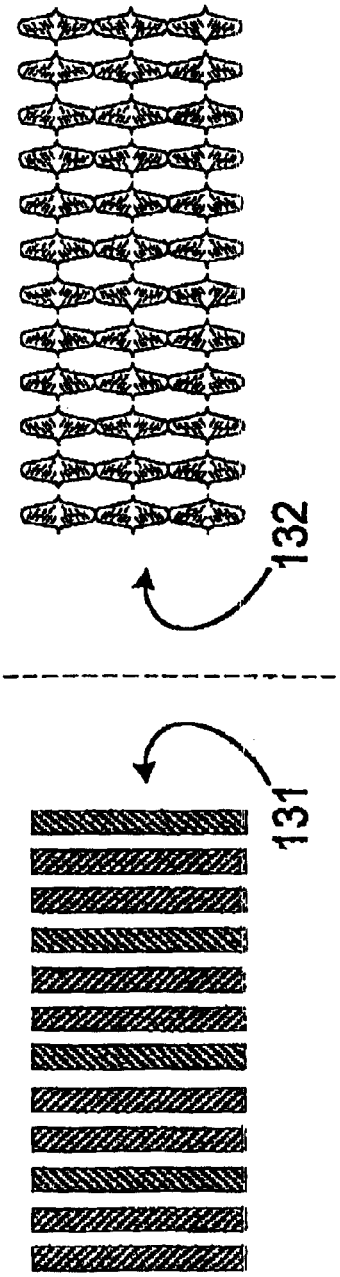
Fig. 13.
Fig. 13a. Prior Art.
Fig. 13b.

METHOD UTILIZING THE SAW VELOCITY DISPERSION EFFECT FOR WEIGHTING BY SHAPING THE ELECTRODE FINGERS OF A SAW INTERDIGITAL TRANSDUCER AND APPARATUS PRODUCED THEREBY

FIELD OF INVENTION

The invention relates generally to surface acoustic wave (SAW) devices and more particularly to SAW transducers with overlapped electrode fingers.

BACKGROUND OF THE INVENTION

Surface acoustic wave (SAW) devices are often employed as filters or resonators in high frequency applications. A SAW device contains a substrate of piezoelectric material. For piezoelectric material, a propagating surface wave is accompanied by an electric field localized at the surface, and this enables the wave to be generated by applying a voltage to an array of metal electrodes on the surface. The electrode array is known as an interdigital transducer. Up until this point, prior art methods for tuning SAW devices have concentrated on the weighting of electrodes, as will be further described hereinbelow. However, the methods for determining how to weight the electrodes have heretofore been working on the assumption that SAW velocity dispersion effects can be ignored, and have assumed that SAW velocity value is an independent constant.

U.S. Pat. No. 5,831,492 to Solie discloses transducers which convert input electrical signals to surface acoustic waves propagating upon the surface of the substrate, and then reconvert the acoustic energy to an electric output signal. The input and output transducers are frequently configured as interdigital electrode fingers, which extend from pairs of transducer pads. Alternating electrical potential coupled to the input interdigital transducers induces mechanical stresses in the piezoelectric substrate. The resulting strains propagate away from the input transducer along the surface of the substrate in the form of surface acoustic waves. These propagating surface waves arrive at the output in an interdigital transducer where they are reconverted to electrical signals.

U.S. Pat. No. 5,818,310 to Solie discloses an electrical filter which transmits signals having frequencies within certain designated ranges or passbands, and suppresses signals having other frequencies outside the passband, or within attenuation bands. An ideal filter would transmit the signal within the passband without attenuation and completely suppress signals within the attenuation bands. In practice, known filters do attenuate the passband signal due to absorption, reflection, or radiation, which results in a loss of desired signal power. Further, such filters do not completely suppress signals within the attenuation bands. The use of surface acoustic wave devices as filters or resonators is well known for having the advantages of high Q, low series resistance, small size, and good frequency temperature stability when compared to other frequency control methods such as LC circuits, coaxial delay lines, or metal cavity resonators.

Trivial periodical uniform interdigital transducers have a sin(x)/x passband shape which is not a preferred filter shape because its transition bandwidth is equal to the filter bandwidth, and more importantly, the first sidelobe is typically only 13 dB below the main response. To synthesize arbitrary passbands, transducer weighting is employed. Filtering is thus accomplished in the process of generating the surface acoustic wave by the input transducer, and in the inverse process of detecting the wave by the output transducer. The most effective filtering is preferably accomplished if both input and output transducers are weighted, and thereby participate in the filtering process. Common transducer weighting techniques include apodization and withdrawal weighting. Apodization is typically used for wideband filters and either apodization or withdrawal weighting typically used for narrowband filters.

The term weighting as used herein refers either to the transducers topology or to the separate finger geometry and polarity. Prior art uses the topology weighting mechanisms which are directly associated with amplitude and phase of currents on electrode fingers and of voltages in the gaps between electrode. Such currents and voltages are considered as the sources of the launched SAW or the result of the detected SAW.

Weighting by apodization refers to the varying of the inter electrode overlapping length.

Capacitive weighting refers to a topology implementation, wherein the weights associated with fingers, are mainly defined by overlaps, both by some far fingers as well as by the nearest fingers.

Withdrawal weighting is the isolation or omission of selected fingers which roughly controls currents and voltages.

Series-block weighting is a kind of capacitive weighting.

Line-width weighting refers to an interdigital transducer, having fingers with different widths, and allows a weak weighting of currents and voltages.

Tapering of the transducer, i.e. weighting that leads to fanned topology, is a weighting in the direction along the electrode finger's length. Such a weighting controls the phase shift of the resonant frequency along the finger's length, because the period of the finger array changes along that direction.

Phase weighting, i.e. phase modulation that leads to chirp transducer, is achieved by varying the distance between fingers along the direction of SAW wave propagation.

There follows a more in-depth description of certain prior art techniques for weighting electrode fingers. Apodization varies the length of the electrodes to achieve an electrode weighting. With apodization, Fourier transform techniques can be readily applied for computing a filter impulse response when defining a special geometric pattern for the interdigital transducer fingers. It is well known that it is not practical to have an input apodized transducer launching a wave directly into an .output apodized transducer, because an apodized transducer launches a wave which has a non-uniform beam profile, and as a receiving transducer, it must see a uniform beam profile. If a surface wave incident upon an apodized transducer is not uniform over the entire width of the beam, the frequency response changes dramatically. For this reason, apodized input and output transducers can not be used to form a filter unless an added structure such as a multi-strip coupler is used. The multistrip coupler positioned between the apodized input and output transducers, transfers energy from a non-uniform beam into an adjacent track, in which a surface acoustic wave is launched as a uniform beam, and is thus compatible with an apodized transducer receiving the uniform beam. However, using an apodized input transducer for generating a surface acoustic wave, and transmitting the wave through a multistrip coupler to an apodized output transducer, widens the filter device, thus requiring increased space within electronic systems seeking to be ever more miniaturized. Further, apodized transducer-to-apodized transducer through a multistrip coupler is only useful on high coupling substrates such as lithium niobate, whereas, in fact, it is not practical on quartz.

Apodized interdigital transducer structure typically has a lot of small overlaps of the electrode fingers. This leads to diffraction spreading of the partial narrow SAW beams and consequently to additional insertion loss (i.e. diffraction loss) and distortion to the SAW device's response. The diffraction effect is not easy for mathematical simulation, and requires sophisticated techniques to be accounted in a synthesis problem. As described in the book by D. P. Morgan titled "Surface-Wave Devices for Signal Processing", in order to simplify these difficulties, either the simplified diffraction model called "parabolic approximation" might be used for ST-quartz substrate, or the diffraction effect is ignored for the minimal-diffraction orientation Y,Z of the lithium niobate substrate. As described in U.S. Pat. No. 6,031,315 to Abbot, the important criterion in the choice of a piezocrystal cut, is the minimal-diffraction orientation, by way of example, for quartz it reduces degrees of freedom for choosing the cut of either the greatest temperature stability or the most appropriate coupling coefficient. An additional difficulty arises here because the diffraction pattern is found to be very sensitive to the details of the SAW velocity anisotropy.

An unweighted transducer is also used with an apodized transducer if less sidelobe rejection can be tolerated for the system. By way of example, a SAW filter design may require performance that an apodized transducer can provide, yet places constraints on filter size or piezoelectric substrate type such that the use of a multistrip coupler is precluded. An alternative approach often includes the use of withdrawal weighting of one transducer with apodization of the other. A transducer having withdrawal weighting launches a uniform wave across the beam profile, and thus is compatible with an apodized transducer. In withdrawal weighting techniques, electrode fingers are selectively removed, or withdrawn, from a uniform interdigital transducer having constant finger overlap in order to attain a desired transducer response. Since the remaining electrodes all have constant overlap, the withdrawal weighted interdigital transducer can be used with the apodized transducer, amplitude weighted, without the need for the multistrip coupler. Good sidelobe suppression can be obtained using this combination of overlap and withdrawal weighting. It is thus attractive for SAW transducers used on low-coupling piezoelectric substrates such as quartz, where the use of multi-strip couplers is normally impractical. However, since a filter approximation deteriorates if too many electrodes are withdrawn, this technique is limited to narrowband filter applications where the number of interdigital transducer electrodes is large. Further, although the withdrawal weighted transducer satisfies the uniform wave condition, withdrawal weighting is a coarse weighting technique, and as a result produces generally poor "far out" sidelobe response, with less than desirable noise rejection. The approximation of the withdrawal weighted transducer characteristics becomes coarse, if the SAW velocity dispersion effect is ignored for high coupling substrates such as lithium niobate. This occurs because the SAW velocity measured over the interval of isolated electrode fingers, differs from the SAW velocity measured over the interval of charged electrode fingers.

Another way to control the frequency characteristics is by using tapered interdigital transducers. The basic tapered transducer has been reported in the literature and in particular in an article by P. M. Naraine and C. K. Campbell tilted "Wideband Linear Phase SAW Filters Using Apodized Slanted Finger Transducers", for Proceedings of IEEE Ultrasonics Symposium, October '83, pp. 113–116, and article by N. J. Slater and C. K. Campbell titled "Improved Modeling of Wide-band Linear Phase SAW Filters Using Transducers with Curved Fingers", IEEE Transactions on Sonics & Ultrasonics, vol. Su-31, No. 1, January 1984, pp. 46–50. C. K. Campbell, et al., discusses wide band linear phase SAW filters using apodized slanted, or tapered, finger transducers. The frequency performance control is based on the changing of distance between adjacent finger's centers in the direction of electrode finger's length and so the interdigital electrode finger array is fitted up to the band pass frequency spectrum. Tapered finger transducer geometries had all the transducer fingers positioned along lines which emanate from a single focal point.

U.S. Pat. No. 4,600,905 to Fredricksen discloses an attempt to improve performance by using the electrode fingers posited into grooves etched into the substrate. The grooves are deeper at the high frequency side of the substrate. The grooves enhance the electromechanical coupling of high frequency components, and thus provide a flatter amplitude response curve. U.S. Pat. Nos. 4,635,008; 4,908,542; 5,831,492 and 5,818,310 to Solie disclose other attempts to improve performance by using hyperbolically tapered electrodes. This improvement is theorized to be based on the fact that there is a hyperbolic dependence between the resonance frequency and the distance between adjacent finger's centers of the periodical uniform interdigital transducer, and it was assumed that the SAW velocity dispersion effect might be ignored when hyperbolically tapered electrode fingers are used.

There are described three types of weighting that are used individually, and in combination, to provide improved frequency selectivity in U.S. Pat. Nos. 5,831,492 and 5,818,310 to Solie. These are series-block weighting, line-width weighting, and capacitive weighting. Series-block weighting and line-width weighting are therein described for preferred alternate embodiments of that art in the mentioned art U.S. Pat. Nos. 5,831,492 and 5,818,310 to Solie, however, the line-width weighting is useful when combined with series-block weighting. Unlike line-width weighting techniques used in the past, limited because of limited tap weight range, when combined with series-block weighting, the achievable tap weight range is much broader. All these three types of weighting are based on effects of electrostatic charge distribution that depends on the geometry of the electrode fingers, their locations and polarities. The SAW velocity dispersion effects were ignored, and the interdigitized electrode finger's line-width weighting technique assumes that SAW velocity value is an independent constant. These approximations are acquitted when the interdigitized electrode fingers are implemented from lightweight metal, for example aluminum, and its thickness is rather small, and when the SAW device operating frequency is rather low.

A multi-strip coupler, i.e., a plurality of electrically disconnected interdigitized electrode fingers, is used in many devices in order to couple interdigital transducers whose active regions do not overlap. The multi-strip coupler also is a SAW transducer, and, as described in an article by L. P. Solie titled "A SAW bandpass filter technique using a fanned multi-strip coupler", Appl. Phys. Lett., 30, 374–376 (1977), a bandpass filtering might be achieved using multi-strip couplers. A weighting of such a multi-strip coupler transducer was realized with whole-number quanta of fingers in a section. Several methods of introducing weighting for multi-strip couplers are described in an article by M. Feldmann and J. Henaff titled "Design of multi-strip arrays", — IEEE Ultrasonic Symp., 1977,. pp.686–690. In particular, one of them is based on an apodization weighting of an electrode fingers length. In another case, multi-strip coupler transducers electrode fingers in one of tracks are fanned in the same manner as in a regular tapered transducer.

In order to decrease the insertion loss of the SAW filter, SAW Single Phase Unidirectional Transducers (SPUDT) are applied. An effect of the directivity is achieved by using of electrode fingers, which tend to reflect the, originating SAW waves launched or detected within the SPUDT. The reflected SAW waves should cancel the originating SAW waves, which propagate in the unwanted direction, and intensify the originating SAW waves which propagate in the desired direction. SPUDT based single SAW filters are inherently narrow-band devices, as described, for example, in an article by C. B. Saw and C. K. Campbell, titled "Improved Design of SPUDT For SAW Filters", —IEEE Proceedings at 1987 Ultrasonics Symposium, Denver Colo., November 1987. A withdrawal weighting technique for a group-type SPUDT was presented in an article by D. P. Morgan and P. Durrant, titled "Low Loss Filters Using Group-Type SPUDT", IEEE Ultrason. Symp., 1990,. pp.31–35. Several methods of weighting SPUDT transducers were suggested in U.S. Pat. Nos. 5,831,492 and 5,818,310 to Solie. These methods are based on such techniques as transducer tapering, series-block capacitive weighing and line-width weighting. All of the weighting techniques discussed hereinabove, as applied to SPUDT transducers, use launching/detecting and reflecting fingers, which have either a uniform width or width configured by the tapering of a transducer. Such techniques, which ignore both the SAW velocity dispersion effect and the SAW reflection coefficient dispersion effect, lose accuracy for heavy, thick metal electrode fingers, as well as for high frequencies.

The SAW velocity dispersion effect in interdigital transducers is well known in literature. As described, for example, in an article by D. P. Chen and H. A. Haus titled "Analysis of Metal-Strip SAW Gratings and Transducers", IEEE-Transactions on Sonics and Ultrasonics, vol. SU-32, No 3, May 1985, in regular interdigitalized electrode finger array the SAW velocity depends on the electrical and mechanical load of the electrode fingers. The SAW velocity depends on the material both of the piezoelectric substrate and the electrode fingers. In the approach of the variational principle, the SAW velocity is expressed with two additive terms. The first term is defined by electrical boundary conditions, and therefore, by the piezoelectrical constants of the piezosubstrate. The second term is defined by the mechanical load, i.e. by densities and elastic constants both of the piezosubstrate and the electrode finger material, as well as by the periodicity of the fingers and their geometry thickness and width. Both of the terms vary smoothly with an electrode finger's width. Calculations show that if an electrode finger's width is in the range from 25% to 60 of the distance between the adjacent finger's centers, both of the terms are approximately proportional to the electrode fingers width. So if the electrode fingers change in width along their length, the SAW velocity dispersion is expected to occur in the same direction.

There is therefore a need in the art for a system to provide an additional weighting mechanism and techniques are needed for fine adjustments of SAW device characteristics at higher frequencies.

SUMMARY OF THE INVENTION

Accordingly, it is a principal object of the present invention to overcome the limitations of existing surface acoustic wave (SAW) devices, and to provide improved methods for designing SAW bandpass filters having a SAW transducer with overlapped electrode fingers.

It is a further object of the present invention to provide methods for designing a transducer for a SAW device with an interdigitized series of non-uniform width electrode fingers, thereby increasing the SAW velocity dispersion effect inherent in such a transducer.

it is still a further object of the present invention to provide an additional weighting mechanism for methods and apparatus for a SAW device transducer having an interdigitized series of non-uniform width electrode fingers.

It is yet still a further object of the present invention to provide methods for achieving fine adjustments of characteristics at higher frequencies of a SAW device.

It is yet a further object of the present invention to provide SAW devices having electrode fingers which have been shaped in order to achieve a weighting which is resultant from a change in the SAW velocity dispersion effect along the lengths of the electrode fingers.

It is moreover an object of the present invention to provide SAW devices having electrode ringers which have been shaped in order to achieve a weighting which is resultant from a change in the SAW reflection coefficient dispersion effect along the lengths of the electrode fingers.

These objects, and others not specified hereinabove, are achieved by an exemplary embodiment of the present invention, wherein electrode fingers, which are implemented in form either like a pair of curled brackets or like pair of rounded brackets or like rhombus, are employed for use in surface acoustic wave (SAW) transducers. Three specific features of the curl, round and rhombus shaped electrodes are widening of the frequency band pass, improving the band pass performance, and focusing of the SAW waves. These three features are caused by the SAW velocity dispersion effect. The interdigitalized electrode finger weighting mechanism, based on the SAW velocity dispersion effect, is applied for the SAW device characteristics improvement The optimization procedure for the high precision design of frequency performance is more effective, since width weighting by means of curled-brackets shaped electrodes adds a degree of freedom. In order to improve attenuation of sidelobe levels around the band pass, in a particular sub-optimal case, the curl's form is calculated as inverse-cosine. In trivial cases, e.g. where frequency performance precision of the waves is not a primary objective, the curled-brackets shape may either be smoothed out to a rounded-brackets shape or be straightened out to a rhombus shape and yet still achieve a far better SAW device over prior art devices.

Use of a shaped electrode finger, having a width that changes along its length, also causes a weak dispersion of electromechanical coupling coefficient and causes electrostatic charge to be distributed from the top to bottom of that electrode. This is an additional inherent tool with which to form frequency performance of SAW signals.

The curl, round and rhombus shaped electrodes operate like focusing lenses for SAW waves. The electrodes, implemented in the shape of a pair of brackets turned inside out, operate like scattering lenses for SAW waves. Thus, precise control over the diffraction-effect becomes attainable due to the variable width and height of such lenses, and due to a technique whereby each long electrode is implemented in the form of several bracket pairs connected to each other. This also liberates the choice of the piezocrystal cut, that is, a piezoelectric cut with either the greatest temperature stability, or the most appropriate coupling coefficient or a compromise between the two, ignoring or almost ignoring the criterion of minimal-diffraction.

A reflecting electrode finger, that changes in width along its length, changes in its reflection coefficient along that direction. This gives an additional important tool with which to form characteristics of reflected SAW signals.

The SAW velocity dispersion effect for SAW's propagating under electrode fingers, which change in width along their length, is increased by increasing the thickness of the electrode fingers, and is also increased when a metal heavier than commonly applied aluminum is used as a conductive material for electrode finger fabrication. So the choice of the electrode's material, and the choice of the thickness, together become the additional degree of freedom for building a weighting function for an interdigital transducer, and for achieving the desired frequency performance.

Prior art weighting mechanisms are based on the distribution of currents and voltages within the SAW transducer. By contrast, weighting to purposely affect the velocity dispersion effect, and other such effects described hereinbelow, is one of the primary teachings of the embodiment of the present invention.

The SAW velocity dispersion depends on both electrical and mechanical load, i.e., it depends on the material both of the piezoelectric substrate and the electrode fingers and depends on the thickness, configuration, polarity and arrangement of the electrode fingers Prior art generally relied on aluminum, the density and elasticity of which are similar to the substrate's density and elasticity respectively, thereby substantially avoiding having to consider the velocity dispersion effect. As mentioned hereinabove, the velocity dispersion effect has heretofore been generally perceived as confusing the predictability of results and not something which should be purposely manipulated.

Use of a heavier metal, for example, gold, for fabricating electrode fingers which change in width along their length, increases the SAW velocity dispersion effect, which is a primary objective of the present invention.

BRIEF DESCRIPTION OF THE DRAWINGS

The present invention will now be described more fully hereinafter with reference to the accompanying drawings, in which:

FIG. 13 shows a multi-strip coupler transducer,

FIG. 13a shows in detail prior art electrode fingers which could be incorporated into the multi-strip coupler transducer shown in FIG. 13;

FIG. 13b shows in detail electrode fingers constructed in accordance with the present invention and which can be substituted into the transducer shown in FIG. 13 in place of the electrode fingers shown in FIG. 13a;

DETAILED DESCRIPTION OF PREFERRED EMBODIMENTS

As illustrated, this invention may be embodied in many different forms and should not be construed as limited to the embodiments set forth herein. Rather, these embodiments are provided so that this disclosure will be thorough and complete, and will fully convey the scope of the invention to those skilled in the art.

Figure 1:
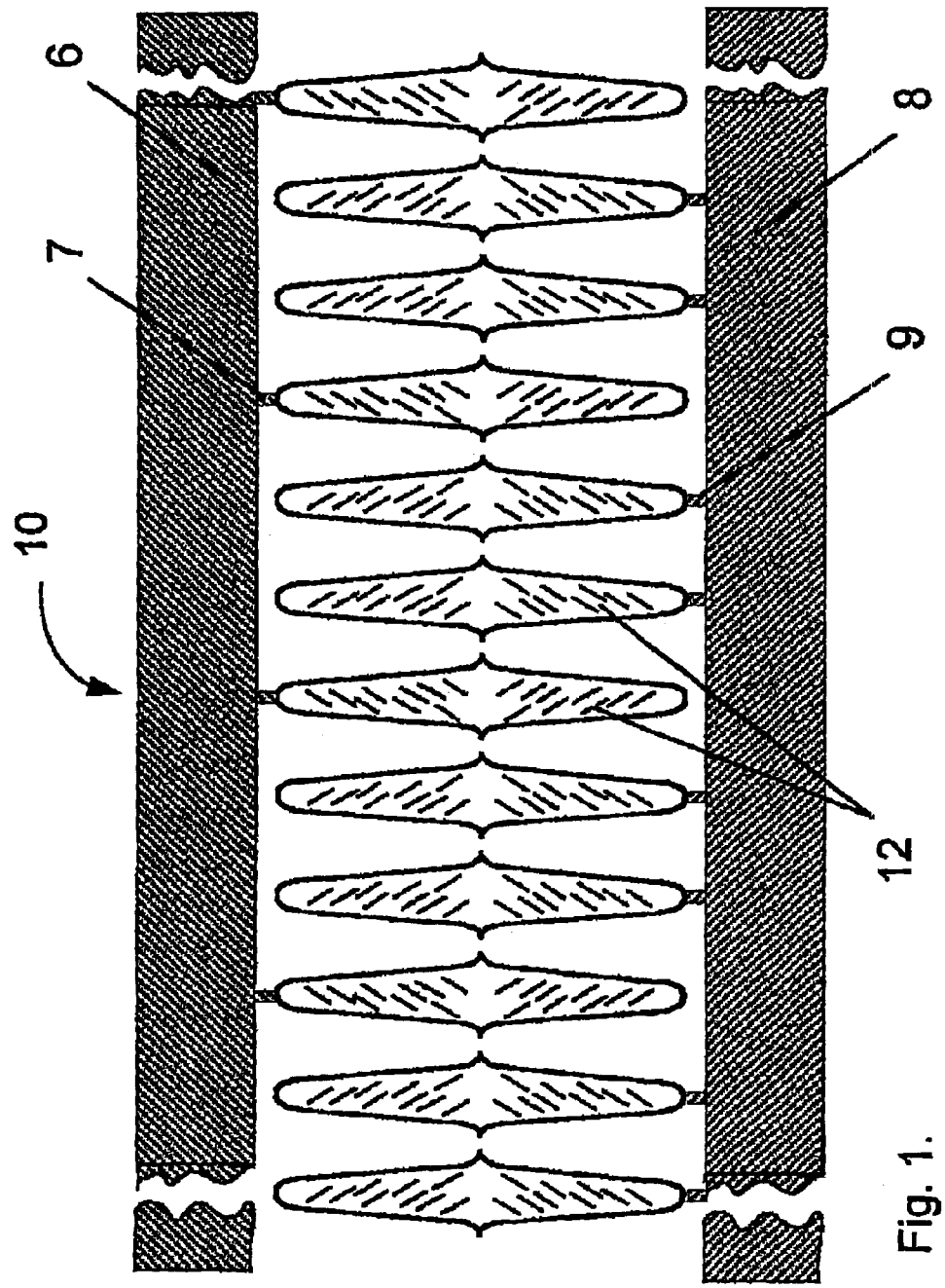
FIG. 1 illustrates an interdigital transducer having electrode fingers which are shaped like pairs of curled brackets in accordance with an exemplary embodiment of the present invention.

Referring now to FIG. 1, there is illustrated an exemplary embodiment of the present invention showing an interdigital transducer 10 having two bus bars 6 and 8 of opposite polarities. Interdigitalized electrode fingers 12, which are shaped like pairs of curled brackets, are each connected to one or the other of bus bars 6 and 8 by contact squares 7 and 9, respectively. Weighting of electrode fingers 12 is accomplished by means of providing them with a curled brackets shape, for example, as shown, which results in an increased SAW velocity dispersion effect. The curled brackets shape of electrode fingers 12 is determined by considering the fact, that if the electrode fingers change in width along their length, the SAW velocity dispersion (i.e. distribution) is expected to occur in the same direction.

The interdigitalized electrode finger weighting mechanism, suggested in the present invention, is based on the stated goal of increasing the SAW velocity dispersion effect, and is applied to achieve improvement in the characteristics of the SAW device.

1. Frequency Response Widening and Improving Band Pass Performance

SAW velocity dispersion causes frequency response widening for an interdigital transducer with electrode fingers which change in width along their length, in contrast to a transducer with conventional electrode fingers, i.e. wherein the fingers are either of uniform width along their length or of width configured in alignment with tapering of the transducer.

Figure 2:
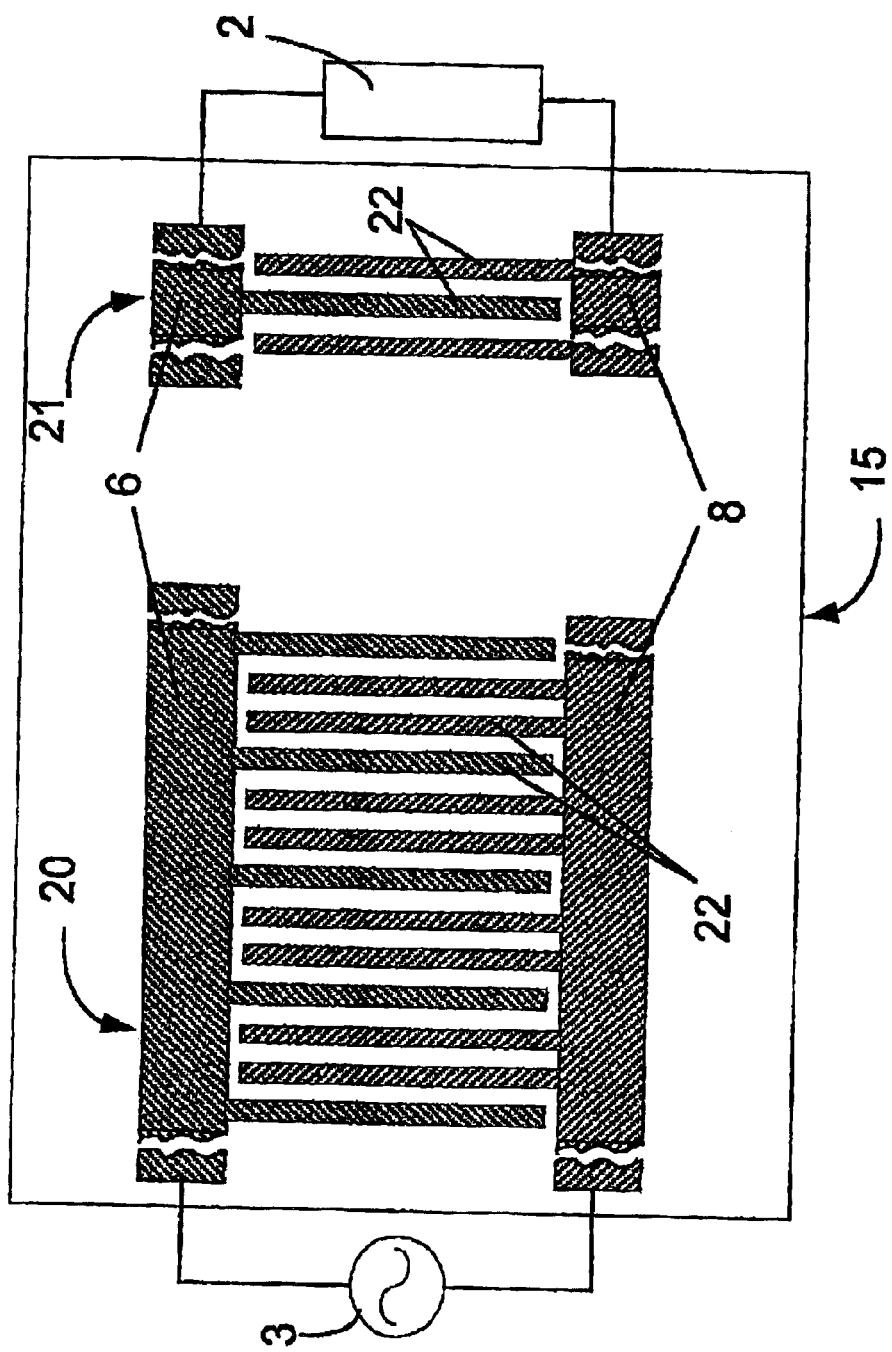
FIG. 2 is a top view of a prior art SAW fitter consisting of input and output known uniform interdigital transducers.

With reference to FIG. 2, there is shown a prior art SAW band pass filter 15, that contains a known trivial periodical uniform interdigital input transducer 20 and an output transducer 21 with opposite-end bus bars 6 and 8, each having a plurality of interdigitized electrode fingers 22 which are of uniform length and width and are parallel. Here, and further hereinbelow in an exemplary embodiment, the external input circuit is a signal generator 3, and the external output circuit is represented as an electrical load 2 of output transducer 21. Interdigital transducer 20, having a large number of fingers, with regularly alternating polarity, has a narrow frequency passband in the form of sin(x)/x. The time domain representation for transducer 20 is modeled in the form of a series of non weighted delta-signals of the values +1 and −1, which are associated with the polarities of fingers 22.

Figure 2A:
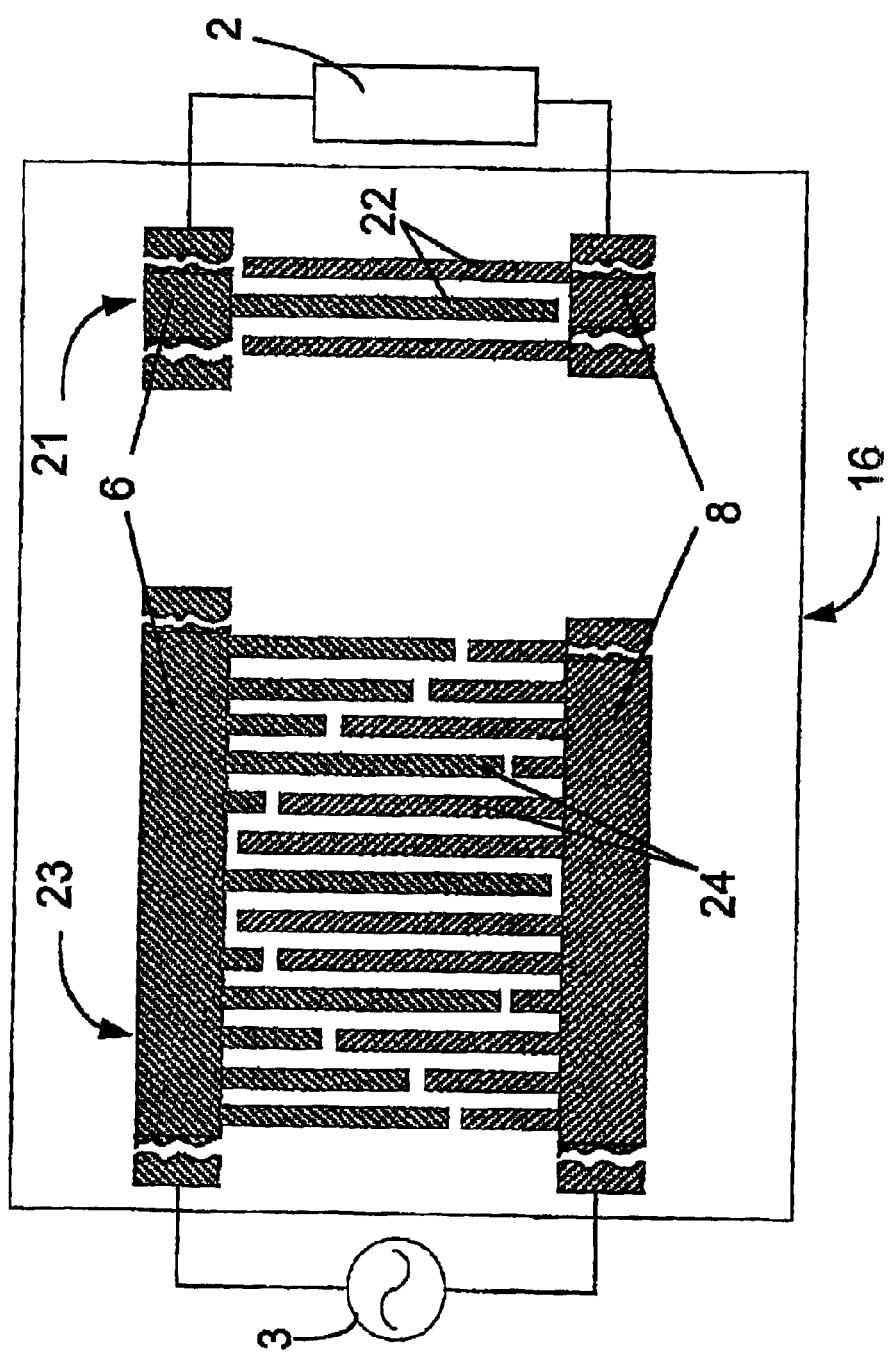
FIG. 2a is a top view of a prior art SAW filter which contains a known input interdigital transducer weighted by apodization of the length of the fingers.

With reference to FIG. 2a, there is shown a prior art weighting technique, using apodized transducer 23 as a component of SAW filter 16, comprising interdigitized and overlapping variable length, uniform width, parallel electrode fingers 24.

Figure 2B:
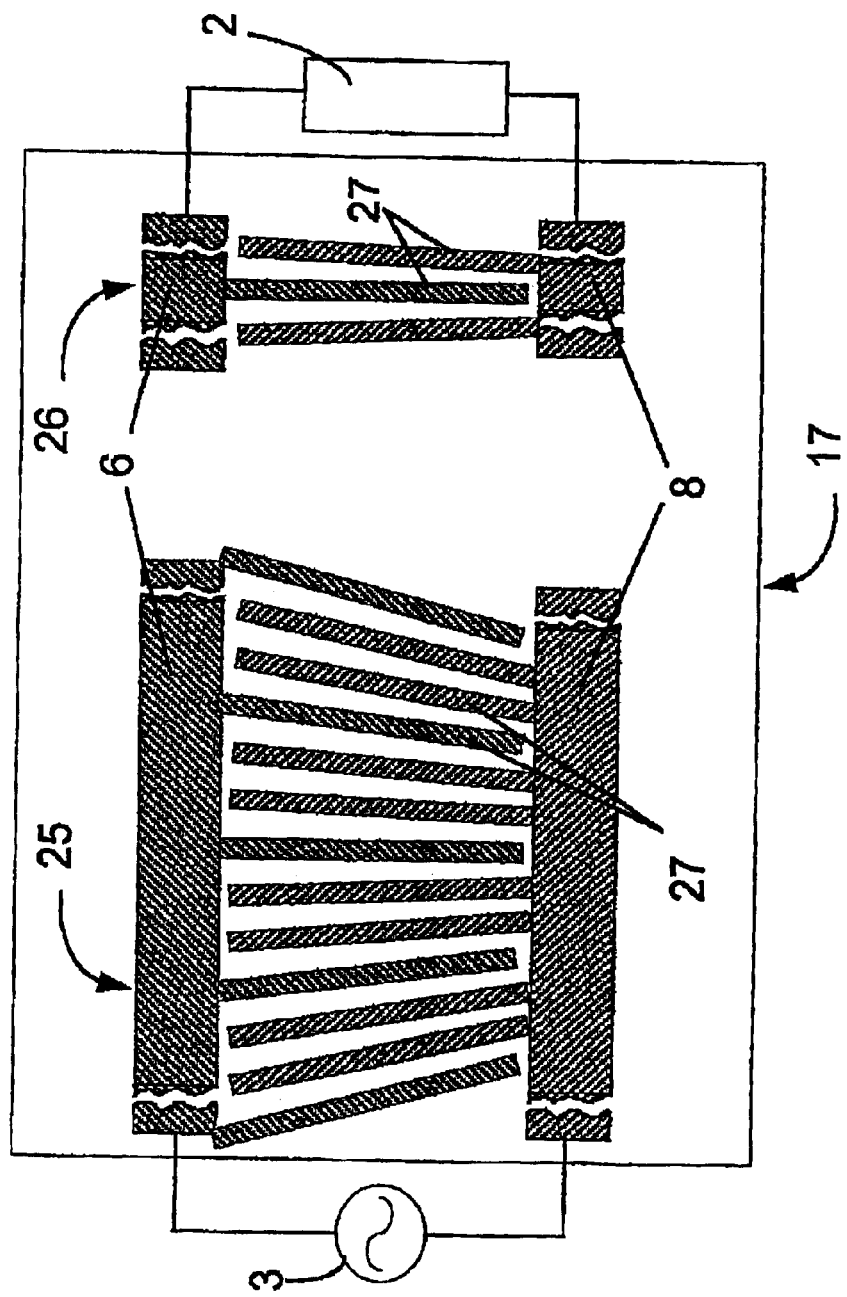
FIG. 2b is a top view of a prior art SAW filter which contains a known input tapered interdigital transducer.

With reference to FIG. 2b there is shown a prior art illustration of a SAW filter 17 containing known tapered transducers 25 and 26. Further shown herein are fanned electrode fingers 27 shown interdigitized and having consistent length and uniform width. Both of the weighting techniques illustrated by FIGS. 2a and 2b, are determined by the polarity distribution, and ignore the effect of SAW velocity dispersion.

Figure 3:
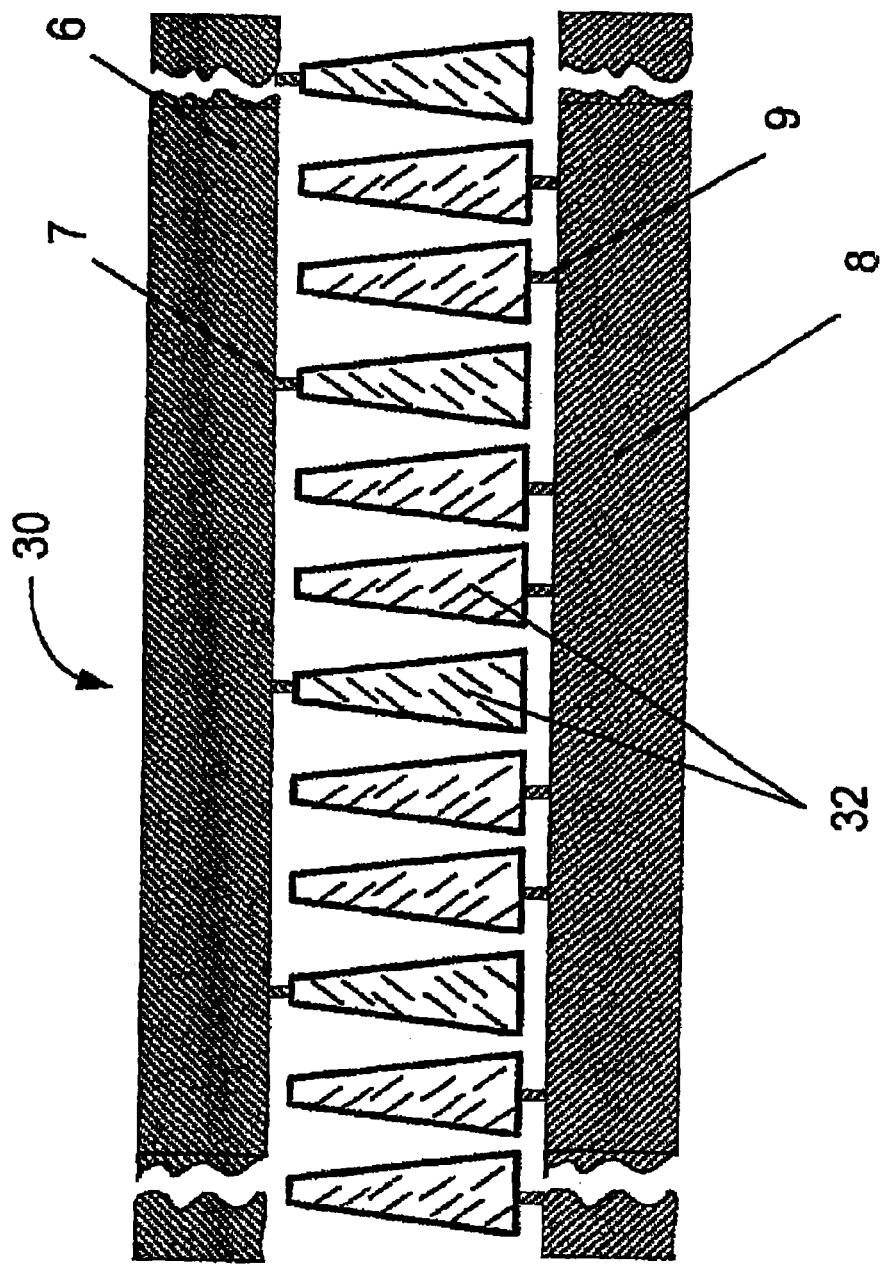
FIG. 3 shows a SAW transducer that contains interdigitalized fingers, each of which linearly changes in width along its length in accordance with an exemplary embodiment of the present invention.

In another exemplary embodiment of the present invention, an alternate interdigital transducer 30 has trapezoidal electrode fingers 32 alternately connected to opposite bus bars 6 and 8 by means of contact squares 7 and 9, respectively. Each finger 32 linearly changes in width along its length, as illustrated in FIG. 3. Modeling of transducer 30 in a manner which takes into consideration the SAW velocity dispersion effect, leads to time domain performance with weights like sin(x)/x. Thus, if transducer 30 has a large number of fingers, then its amplitude characteristics look rectangular in the frequency domain. The passband is widened as well, according to the amount of the dispersion effect. If transducer 30 does not have a large number of electrode fingers 32, then its frequency response has enlarged sidelobes, but in any case these frequency sidelobes are less than the sidelobes of interdigital transducer 20 with uniform width electrode fingers 22.

Figure 4:
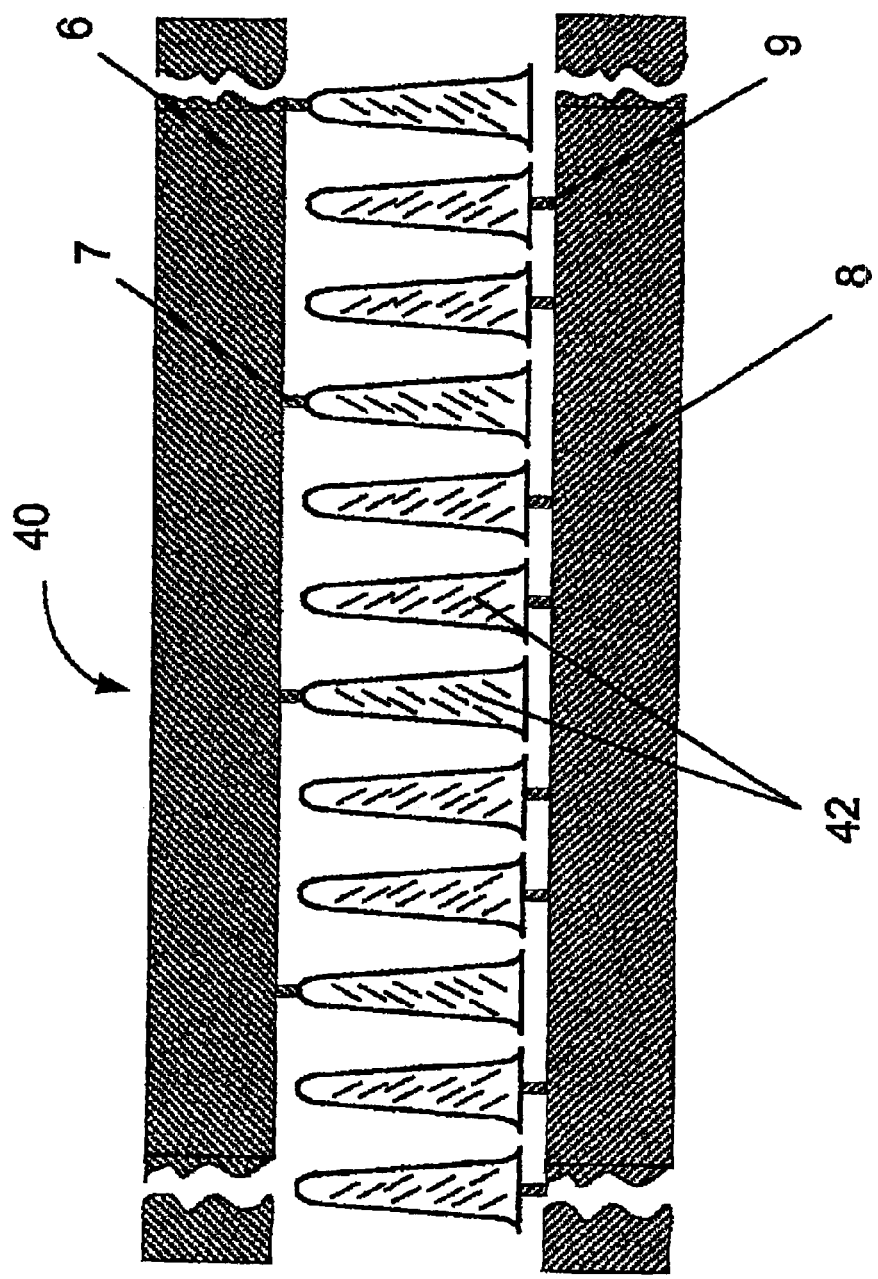
FIG. 4 shows a SAW transducer having interdigitalized fingers, wherein each finger changes in width along its length, and wherein the curl form of finger is calculated as inverse-cosine in accordance with an exemplary embodiment of the present invention.

In order to improve attenuation of sidelobe levels around the passband for inter-digital transducer 30 having an arbitrary number of fingers, trapezoidal fingers 32 might be replaced by bell-shaped with curled ends fingers 42, constituting another alternate interdigital transducer 40, that is illustrated in FIG. 4 as an exemplary embodiment of the present invention. In a particular sub-optimal embodiment, the curt form of finger's 42 is calculated as inverse-cosine.

2. SAW Beam Focussing

Providing electrode fingers in the shape of a lens, causes the SAW waves to be focused or scattered due to the SAW wave dispersion effect in a manner analogous to the scattering or focussing of light by a common optical lens.

SAW beam deflection is caused by both an anisotropic piezosubstrate and by an artificially generated SAW velocity dispersion along the length of tapered electrode fingers shaped, for example, like fingers 32 or fingers 42. To avoid such SAW beam deflection, it is an aspect of the present invention, to provide paired-brackets shaped electrode fingers 52, such as those shown in FIG. 5. Due to the SAW velocity dispersion effect, electrode fingers 52 provided in the shape of a pair of brackets, behave like focussing lenses for the propagating SAW waves. Scattering electrode fingers 53, which are implemented in the shape of a pair of braces turned inside out, operate like scattering lenses for the SAW waves.

Figure 6:
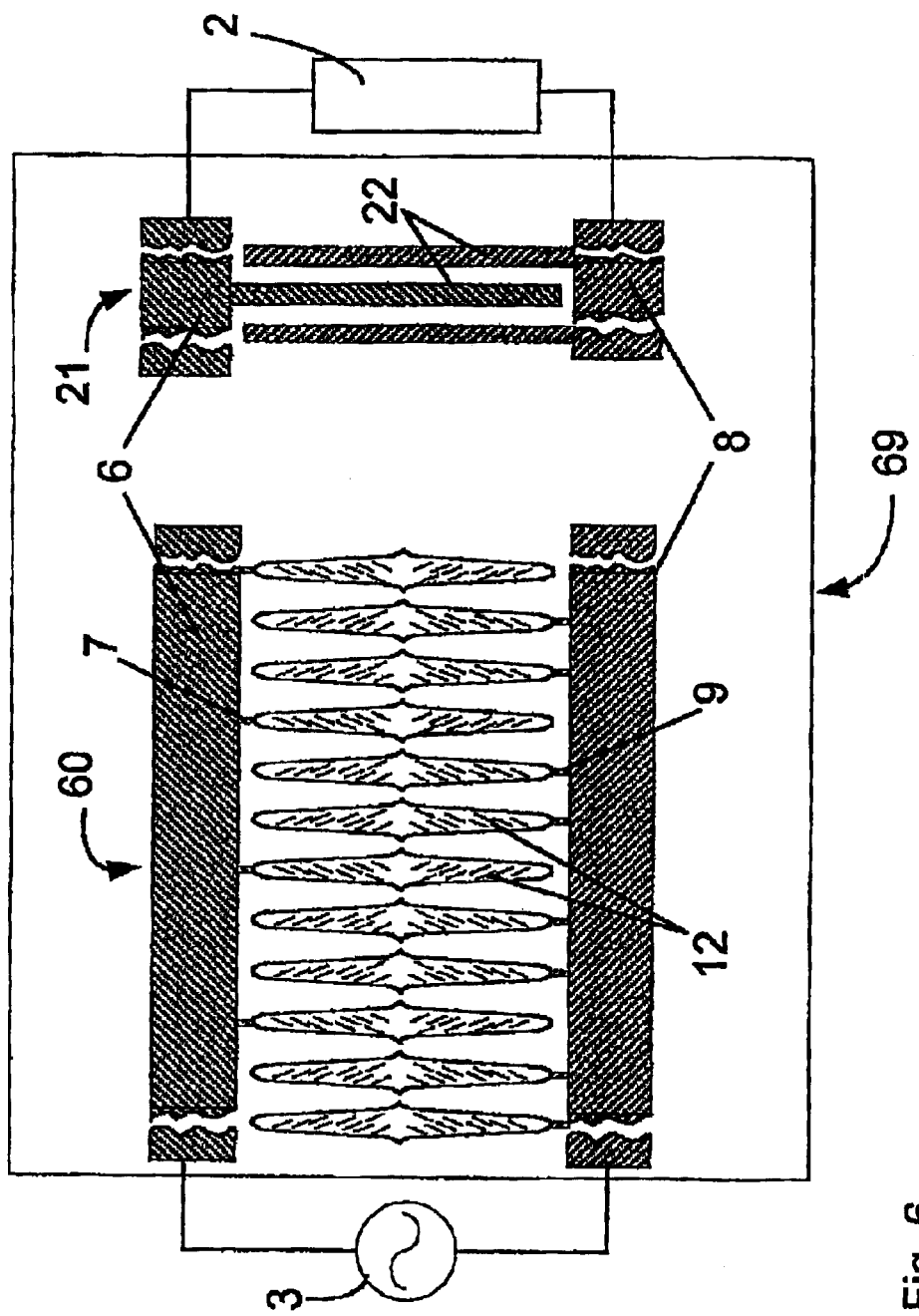
FIG. 6 shows a SAW filter which contains an input interdigital transducer having electrode fingers, wherein each finger is weighted by being shaped into a pair of curled brackets in accordance with an exemplary embodiment of the present invention.

Combining the optimal curl form of finger 42 with paired-brackets fingers 52 for focusing SAW waves, results in interdigitalized electrode fingers 12, each of which is shaped in form of a pair of curled brackets, which are suggested as a preferred embodiment in the present invention, as shown in FIG. 6.

Figure 6A:
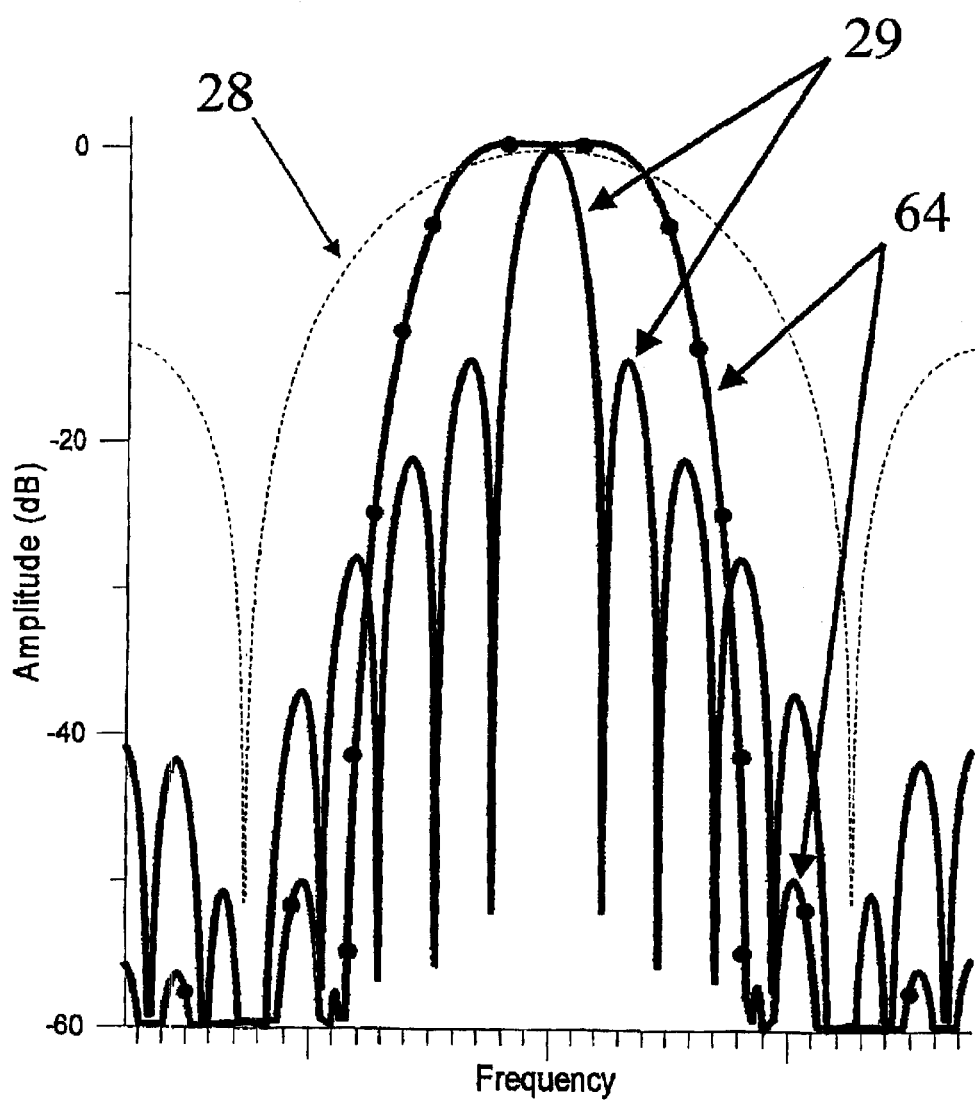
FIG. 6a illustrates the effects of both widening the passband, and improving a SAW filter's frequency characteristics, by reducing the sidelobes, in accordance with an exemplary embodiment of the present invention.

By way of example, and with reference to the calculated frequency response curves of FIG. 6a, the following comparison is made. Compare the frequency characteristics 29 of a prior art narrow band filter 15 based on simple uniform interdigital transducer 20 of FIG. 2, with the characteristics 64 of the finer 69 of FIG. 6 based on alternate transducer 60. Note that transducer 60 contains the same number of interdigitalized electrode fingers 12 as transducer 20 having uniform cross-section, but herein each finger 12 is shaped in the form of a pair of curled brackets. The calculations take into consideration that the fingers 12 are fabricated from gold. The calculations also take into account the inherent distribution of electrostatic charge on shaped electrode fingers but ignore the fact that providing the electrode finger with a shape where the width changes along its length also leads to a weak dispersion of the electromechanical coupling coefficient Both filters 15 and 69 have an identical detecting transducer 22, whose contribution to both frequency response 29 and frequency response 64 is plotted as dashed line 28.

Figure 5:
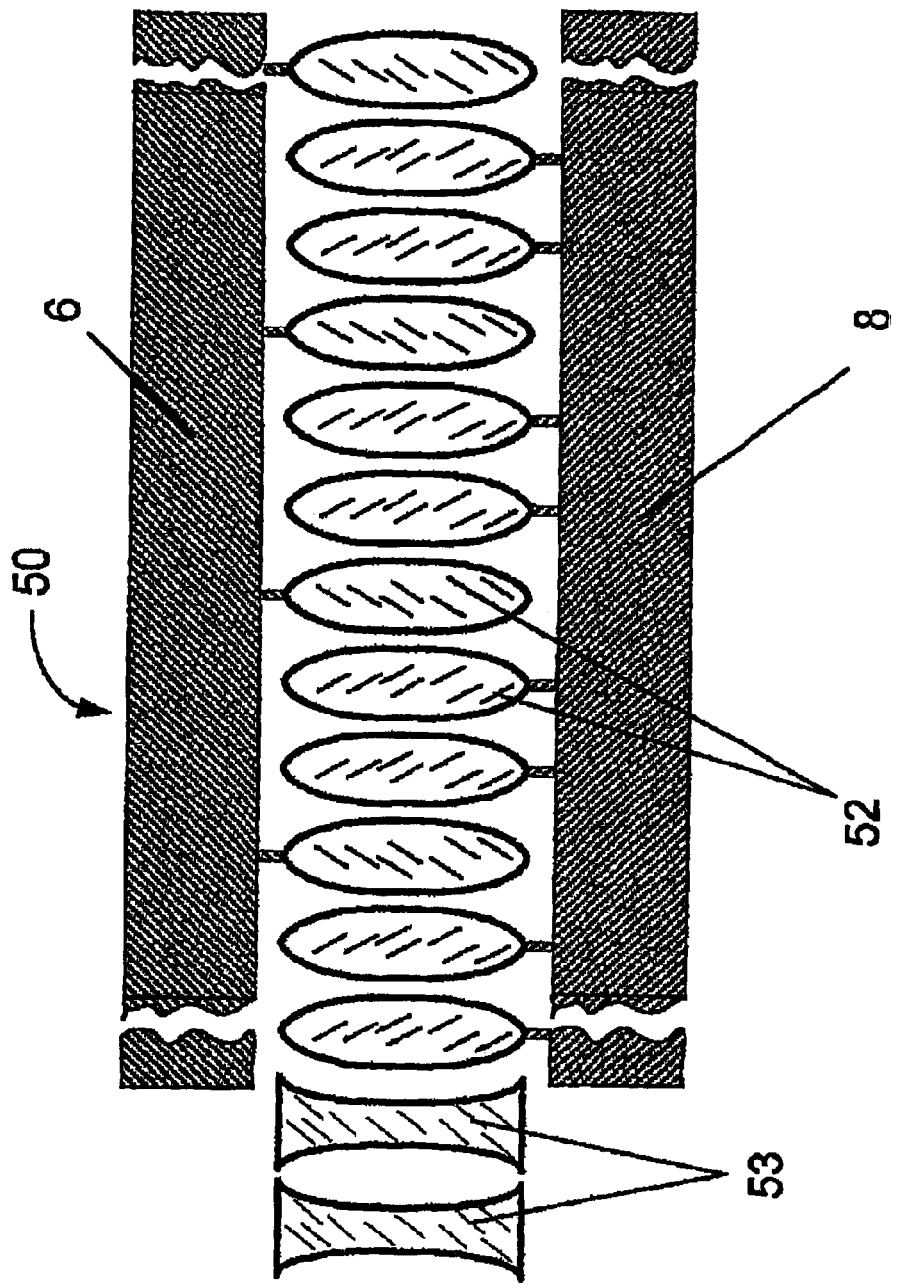
FIG. 5 shows a SAW transducer that contains interdigitalized electrode fingers, wherein each finger has the form of a lens (i.e. the form of a pair of round braces), in accordance with an exemplary embodiment of the present invention.

In a trivial case the curled brackets shape may be smoothed out to the rounded brackets shape of electrode fingers 52, wherein such an exemplary embodiment of the present invention is illustrated in FIG. 5. Alternatively, the curled-brackets shape may be straightened out to rhombus-shaped electrode fingers 72, wherein such an embodiment of the present invention is exemplified in FIG. 7.

Figure 8:
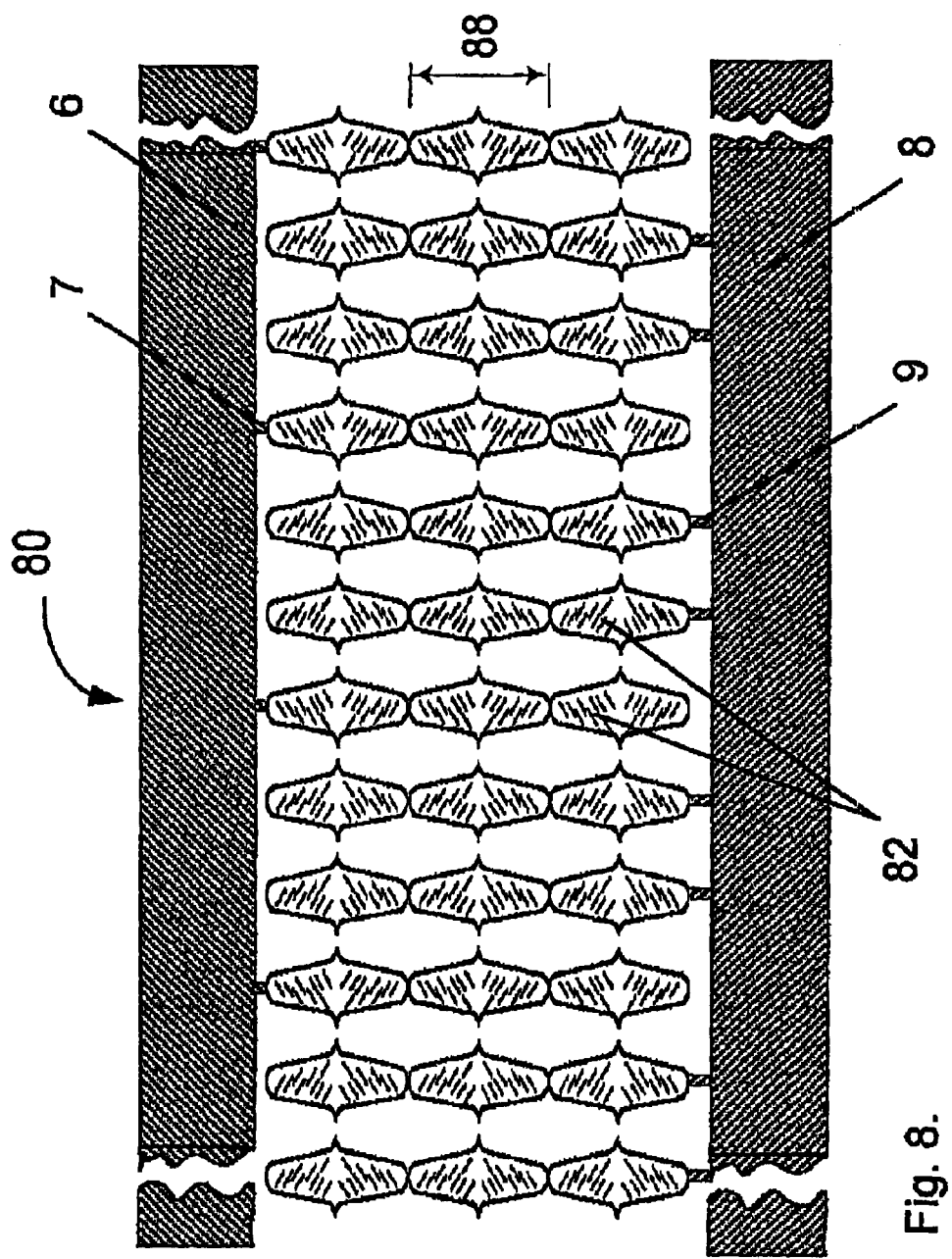
FIG. 8 shows a SAW transducer that contains interdigitalized electrode fingers, wherein a finger has the form of cascade connected curled brackets, in accordance with an exemplary embodiment of the present invention.

Another exemplary embodiment of the present invention is illustrated in FIG. 8. In FIG. 8 it is shown that precise control over the diffraction-effect is achieved by varying the electrode finger lens height 88, and by implementing the long electrode fingers 82 in the form of cascade-connected bracket pairs.

The use of shaped electrode fingers to focus the SAW permits greater freedom to choose the piezocrystal cut. That is, to choose either a cut with the greatest temperature stability or a cut with the most appropriate coupling coefficient, or a compromise between the two, ignoring or almost ignoring the criterion of minimal-diffraction.

3. Dispersion Effect Control By Electrode Material and Thickness.

The SAW velocity dispersion effect is increased, by increasing the thickness of the electrode fingers, or by using a heavier metal than widely used aluminum as a conductive material for electrode fingers implementation, or both. So the choosing of the electrode's material and its thickness becomes an additional degree of freedom for building a weighting function for an interdigital transducer and achieving the desired frequency performance. If a transducer is designed with fingers changing in width along their length, as suggested in the present invention, an additional independent widening of the normalized (relative) frequency passband, with no resultant widening of the transitional area, and with improving characteristics of decreasing sidelobes, becomes easily feasible by taking advantage of the SAW velocity dispersion effect. It might be regulated using the additional degrees of freedom available, i.e., by using either thicker electrode fingers, or metals heavier than the most-widely used material, aluminum, as a conductive material for implementing the electrode fingers.

4. Combination of Weighting Techniques.

The SAW velocity dispersion effect is independent of finger polarity, so the inventive weighting technique may be combined with any technique of polarity weighting as a separate option.

Figure 7:
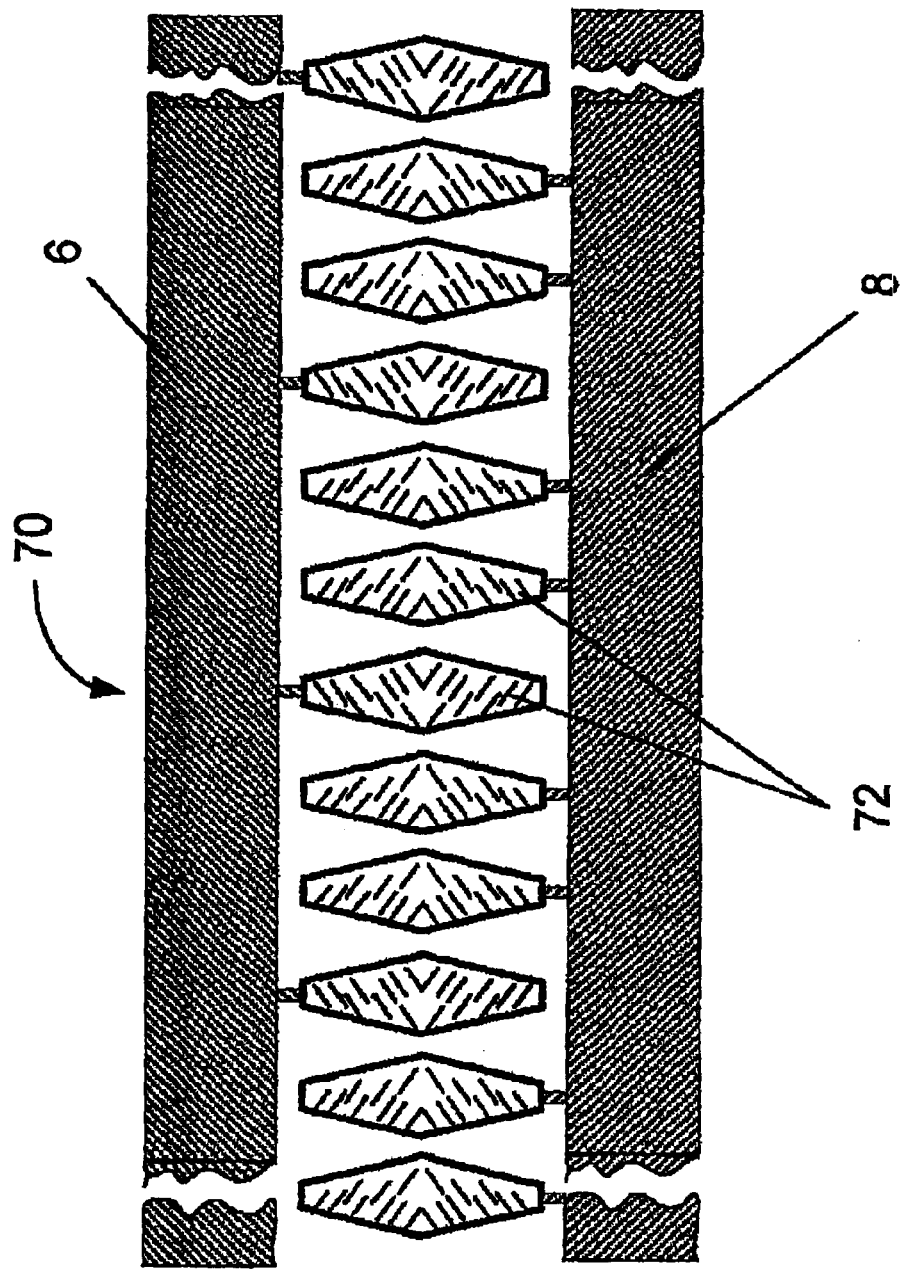
FIG. 7 shows a SAW transducer that contains interdigitalized electrode fingers, wherein a finger has the form of a rhombus, in accordance with an exemplary embodiment of the present invention.

Five alternative exemplary embodiments of the present invention, illustrated in FIG. 9, FIG. 10, FIG. 11, FIG. 12 AND FIG. 13, demonstrate possible combinations of the various mechanisms of interdigitalized electrode finger weighting suggested in the present invention, together with conventional techniques. In all the examples, the curled brackets shape may either be smoothed out to a rounded brackets shape, as is shown in FIG. 5, or be straightened out to rhombus shape, as illustrated in FIG. 7.

Figure 9:
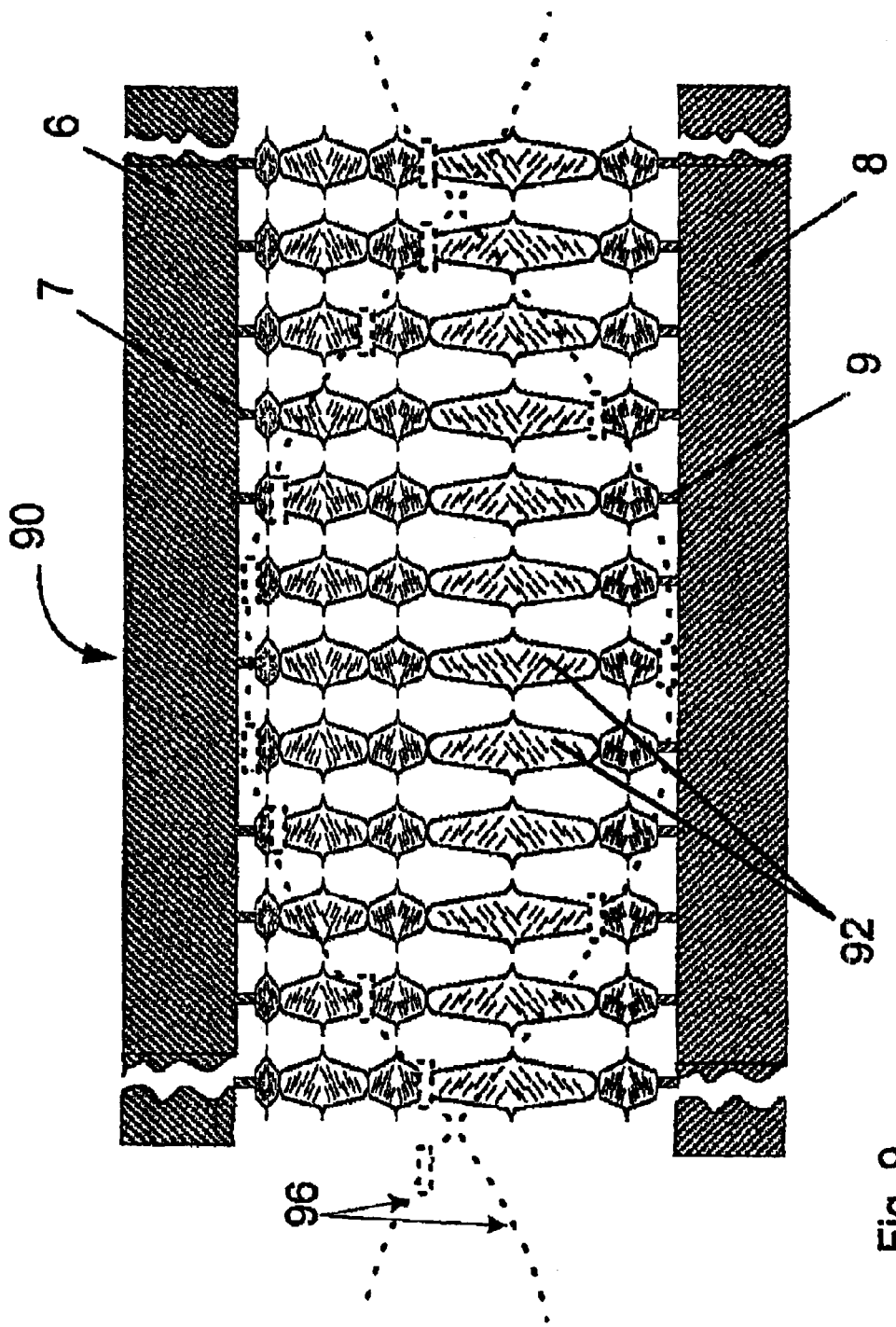
FIG. 9 shows a SAW filter, which contains an input interdigital transducer having a combined weighting of electrode fingers, i.e. each finger is weighted by the combination of the inventive shape of a pair of curled brackets and by apodizatlon in accordance with an exemplary embodiment of the present invention.

FIG. 9 shows an exemplary embodiment of the present invention for combining the suggested weighting mechanism of the present invention with the known apodization technique. By applying the combination interdigitalized electrode fingers 92, which are weighted both by their length and by the shape of curled-brackets or cascade-connected brackets, to an apodized SAW transducer 90, a characteristic of an arbitrary passband may be achieved. In this case, the combination fingers 92, weighted by their length, according to apodizat; on lines 96 and weighted by shaping like curled brackets, as first taught in the present invention, also permits control over the diffraction spreading caused by the SAW beams focussing effect. The feature of widening the normalized (relative) frequency passband, with no resultant widening of the transitional area by the SAW velocity dispersion effect-based shape weighting of combination curled-brackets fingers 92, allows the use of enlarged overlaps, compared to the overlaps of prior art apodization techniques.

Figure 10:
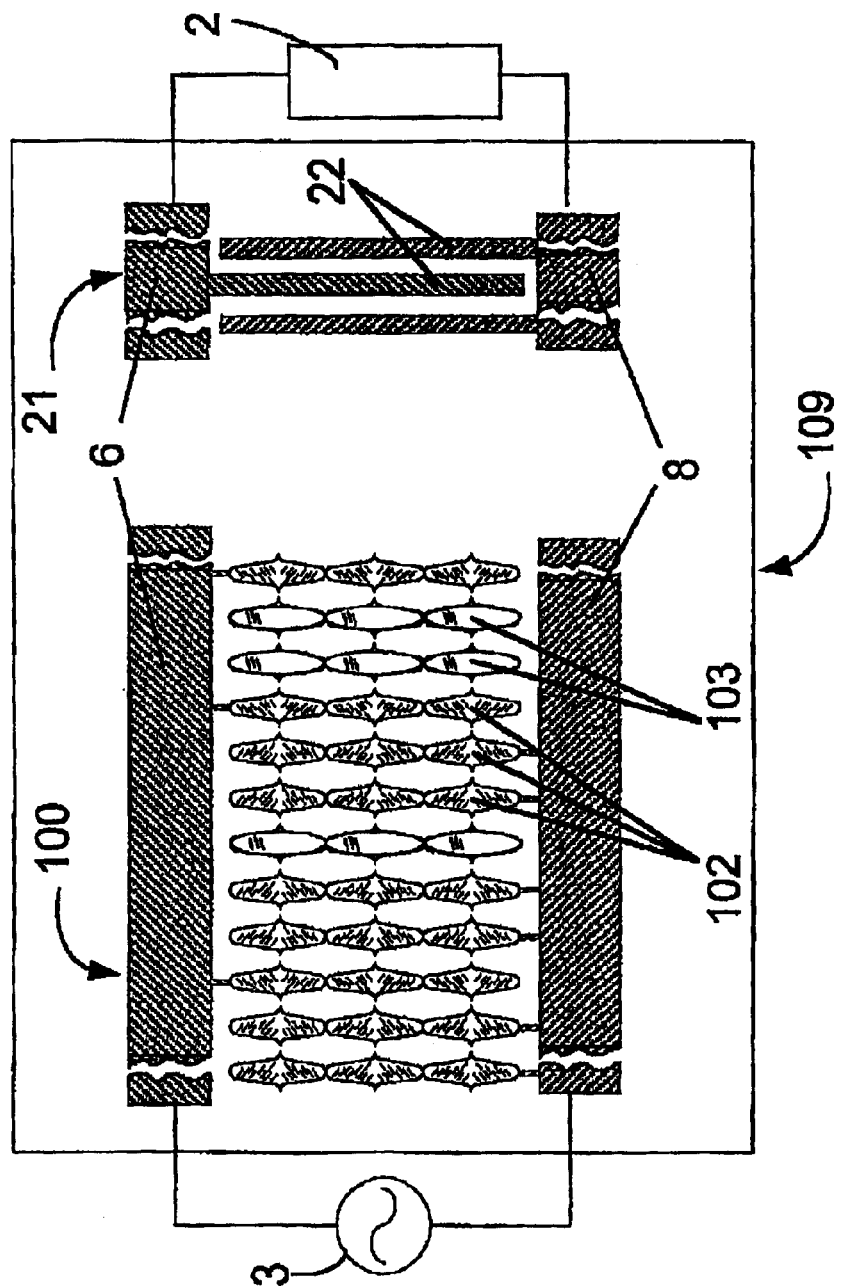
FIG. 10 shows a SAW filter, which contains an input interdigital transducer having a combined weighting, i.e. each finger is weighted by the inventive shape of a pair of curled brackets and the whole transducer is weighted by withdrawal weighting in accordance with an exemplary embodiment of the present invention.

FIG. 10, shows an exemplary embodiment of the present invention for combining the suggested weighting mechanism of the present invention with known withdrawal weighting. As a rule, the known withdrawal weighting technique is applied to narrow bandpass transducers and problems arise trying to enlarge the passband without also distorting the frequency characteristics for such transducers. A SAW filter 109, that contains an input withdrawal weighted SAW transducer 100 and output trivial uniform transducer 21, is schematically illustrated in FIG. 10, as an exemplary embodiment of the present invention. The charged electrode fingers 102 and isolated electrode fingers 103, are weighted by shaping them. Electrode fingers 102 are connected to one or the other of opposite bus bars 6 or 8, and isolated electrode fingers 103 are electrically isolated. Applying the weighting of electrode fingers 102 and 103 by their shape, as suggested in the present invention, permits widening the transducer's 100 frequency characteristics passband with no resultant widening of the transitional area and with additional improvement of the frequency characteristics. The use of isolated electrodes 103, in non-charged vacant places, is mainly required by the present invention's deliberate utilization of the SAW velocity dispersion effect.

Figure 11:
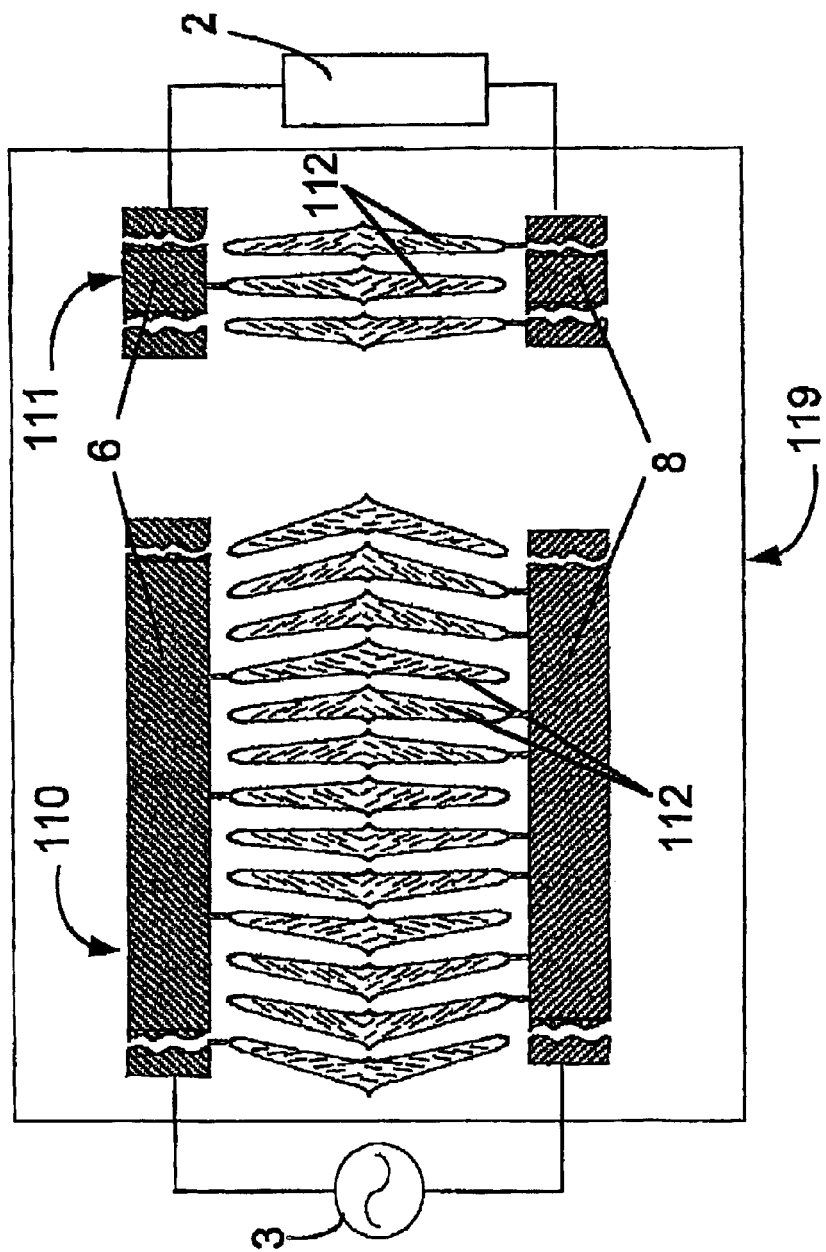
FIG. 11 shows a SAW filter, which contains an input interdigital transducer having a combined weighting, i.e. each finger is weighted by the inventive shape of a pair of curled brackets and the whole transducer is tapered (preferred tapering is such that the transducer is tapered in both directions to opposite bus bars) in accordance with an exemplary embodiment of the present invention.

FIG. 11, shows an exemplary embodiment of the present invention for use of the suggested weighting mechanism of the present invention, as applied to tapered input transducer 110 and tapered output transducer 111. A preferred embodiment of such an application is a tapering of the transducer in both directions, from the middle, along the length of curled brackets electrode fingers 112, to opposite bus bars 6 and 8. The general additional curvature of curled-brackets electrode fingers 112 is configured in alignment with the tapering of transducers 110 and 111.

Figure 12:
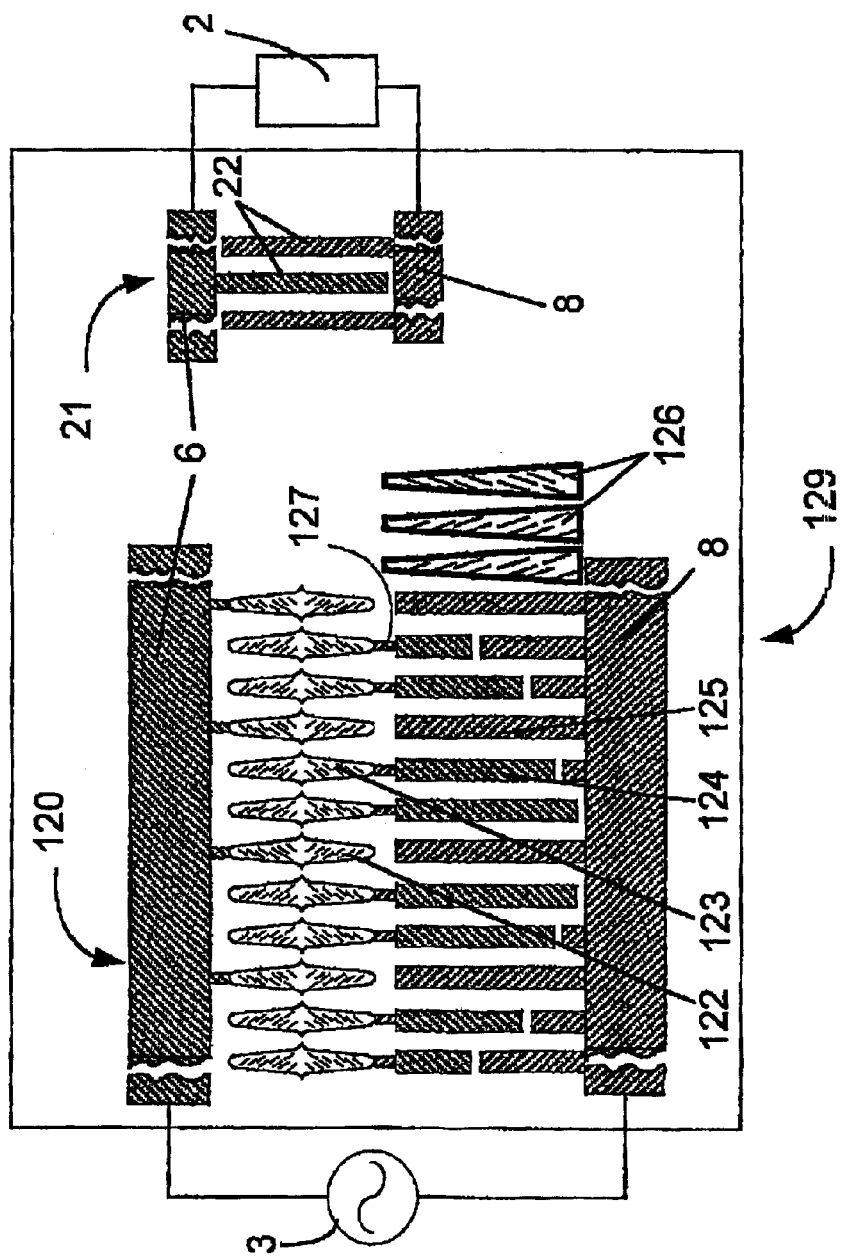
FIG. 12 shows a SAW filter, which contains an input interdigital transducer having a combined weighting, i.e. each finger is weighted by the inventive shape of a pair of curled brackets and by one of the styles of capacitive weighting in accordance with as an exemplary embodiment of the present invention.

FIG. 12, shows an exemplary embodiment of the present invention for combining the suggested weighting mechanism of the present invention with prior art capacitive weighting. Electrode fingers 122 and 125 are connected to opposite bus bars 6 and 8, and are not overlapped directly. Electrode fingers 122 and 125 have a capacitive inter-influence because interdigitalized electrode fingers 123 and 124 are connected to each other by contact squares 127. Fingers 126 are for deflection and scattering of unwanted SAW beams.

FIG. 13, by way of example, shows a multi-strip coupler transducer 130, that is applied for bandpass filtering. Prior art interdigitalized electrode fingers 131 have the form of uniform strips, as shown in FIG. 13a.

FIG. 13b, shows an exemplary embodiment of the present invention for the use of fingers 132, weighted by being shaped into cascade-connected curled brackets. It allows retention of the SAW beams with no diffraction spreading, and improves the frequency band pass characteristics in contrast with the use of prior art fingers 131 shown in FIG. 13a.

5. Reflection Coefficient.

The SAW reflection coefficient depends on the finger width, so the weighting technique of the present invention may be applied to the weighting of reflecting fingers. This feature becomes particularly useful, for example, in unidirectional interdigital transducers, wherein the widening of the frequency passband is an especially difficult problem.

Figure 14:
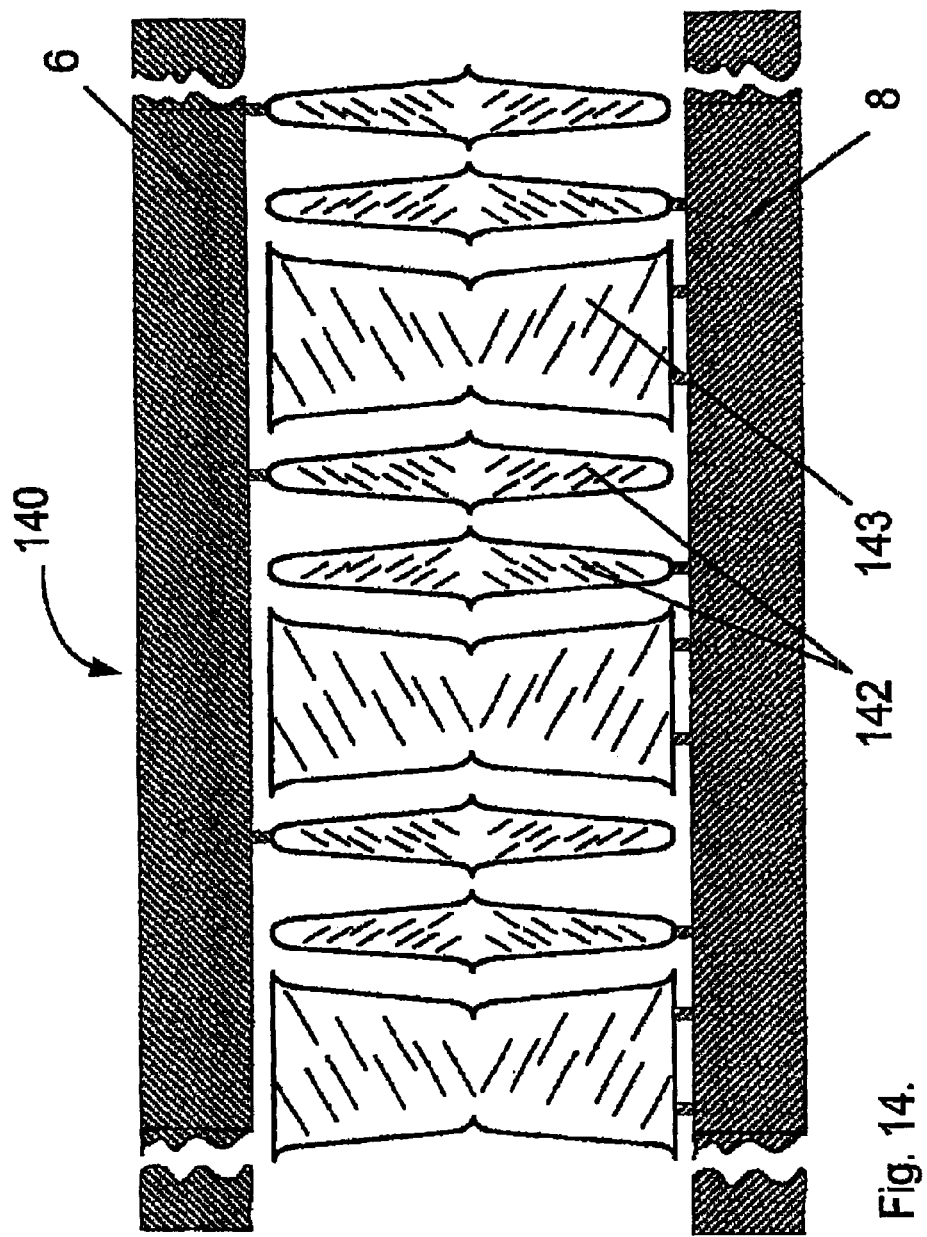
FIG. 14 shows a unidirectional transducer with reflecting electrode fingers, wherein both active launching- and reflecting-types of electrode fingers are shaped like pairs of curled brackets in accordance with an exemplary embodiment of the present invention.

An exemplary embodiment of the present invention, which is illustrated in FIG. 14, shows an application of the weighting mechanism to single phase unidirectional transducer (SPUDT) 140. The electrode fingers 142 are launching electrodes if the transducer 140 is used as an input transducer, and are receiving electrodes if the transducer 140 is used as an output transducer. The electrode fingers 143 are reflecting fingers. Electrode fingers of both of types, launching/receiving 142 and reflecting 143, are weighted as to their shape. Both electrodes 142 and electrodes 143 change in width along their length. The weighting mechanism for launching/receiving electrode fingers 142 is based on SAW velocity dispersion. The weighting mechanism for reflecting electrode fingers 143 is based on both effects: SAW velocity dispersion and SAW reflection coefficient dispersion. Such weighting provides a widening of the frequency band pass characteristics of unidirectional inter-digital transducers.

References Cited

| | | | |
|---|---|---|---|
| 4600905 | July, 1986 | Fredricksen | 333/196. |
| 5831492 | November, 1998 | Solie | 333/193. |
| 5818310 | October, 1998 | Solie | 333/196. |
| 4635008 | Jan. 6, 1987 | Solie | 333/195. |
| 4908542 | Mar. 13, 1990 | Solie | 310/313.B. |
| 6031315 | Feb. 29, 2000 | Abbot | 310/313.B. |
| 4162465 | July, 1979 | Hunsinger et al. | 333/151. |

Other References

P. M. Naraine and C. K. Campbell, Wide Band Linear Phase SAW Filters Using Apodized Slanted Finger Transducers,—1983 IEEE Ultrasonics Symposium, pp. 113–116

N. J. Slater and C. K. Campbell, Improved Modeling of Wide-Band Linear Phase SAW Filters Using Transducers with Curved Fingers,—IEEE Transactions on Sonics & Ultrasonics, vol. SU-31, No. 1, January 1984, pp.46–50

D. P. Morgan, Surface-Wave Devices for Signal Processing,—Elsevier, Amsterdam, 1985, Chapter-6, pp. 129–155.

D. P. Chen and H. A. Haus, Analysis of Metal-Strip SAW Gratings and Transducers,—IEEE Transactions on Sonics and Ultrasonics, vol. SU-32, No 3, May 1985

L. P. Solie, A SAW bandpass filter technique using a fanned multi-strip coupler,—Appl. Phys. Left., 30, 374–376 (1977)

M. Feldmann and J. Henaff, Design of multi-strip arrays,—IEEE Ultrasonic Symp., 1977, pp. 686–690.

C. B. Saw and C. K. Campbell, improved Design of SPUDT For SAW Filters,—IEEE Ultrason. Symp., 1987.

D. P. Morgan and P. Durrant, Low Loss Filters Using Group-Type SPUDT Transducers,—IEEE Ultrason. Symp., 1990, pp. 31–35

I claim:

1. A weighted SAW inter-digital transducer (IDT) having at least two internal electrode fingers shaped and arranged with a predetermined periodicity, each of said fingers having a shape defining a ratio between its width and its arrangement-periodicity, and also defining variable spacing between each of said fingers, such that said ratio varies substantially along each of said fingers, said variable ratio inducing SAW velocity dispersion along said fingers, thereby providing a weighting mechanism to control weighting coefficients for achieving desired frequency characteristics of the IDT.

2. A transducer according to claim 1, wherein said inter-digitized finger is provided with a shape which controls the diffraction effect by either focusing, scattering or deflection of SAW beam resulting from the SAW velocity dispersion effect along the electrode fingers' lengths.

3. A transducer according to claim 1, wherein the shapes of said electrode fingers generally are not all identical.

4. A transducer according to claim 1, wherein said at least one interdigitized electrode finger has at least one edge shaped in the form of a curled bracket.

5. A transducer according to claim 1, wherein said at least one interdigitized electrode finger has at least one edge in the form of a rounded bracket.

6. A transducer according to claim 1, wherein said at least one interdigitized electrode finger has at least one edge in the form of a refracted line.

7. A transducer according to claim 1, wherein said at least a portion of at least one interdigitalized electrode finger has the shape of a rhombus.

8. A transducer according to claim 1, wherein said at least one interdigitized electrode finger has at least a portion of one edge in the form of a curled bracket.

9. A transducer according to claim 1, wherein said at least one interdigitized electrode finger has at least a portion of one edge in the form of a rounded bracket.

10. A transducer according to claim 1, wherein said at least one interdigitized electrode finger has at least a portion of one edge in the form of a refracted line.

11. A transducer according to claim 1, wherein said at least one interdigitized electrode finger has trapezoidal form.

12. A transducer according to claim 1, wherein said at least one interdigitized electrode finger has at least a portion of one edge in the form of a bell.

13. A transducer according to claim 1, wherein said transducer has a non-rectangular profile.

14. A transducer according to claim 1, wherein the distances between adjacent electrode finger pairs are varied.

15. A transducer according to claim 1, wherein said transducer is apodized by providing electrode fingers having varying lengths.

16. A method for weighting a SAW interdigital transducer having a plurality of interdigitized electrode fingers comprising providing at least one internal surface edge of at least one interdigitized electrode finger with a shape defining a ratio between its width and its arrangement-periodicity, and also defining variable spacing between each of said fingers, such that said ratio varies substantially along each of said fingers, said variable ratio inducing SAW velocity dispersion along said fingers, thereby providing a weighting mechanism to control weighting coefficients for achieving desired frequency characteristics of the IDT.

17. The method according to claim 16, wherein at least a portion of said at least one electrode finger is provided with the shape of curled-brackets.

18. The method according to claim 17, wherein said curled-brackets comprises a curve which can be calculated as inverse-cosine.

19. The method as recited in claim 16, wherein said at least one electrode finger is provided in the shape of a rhombus.

20. The method as recited in claim 16, wherein at least a portion of said at least one electrode finger is provided in the shape of rounded-brackets.

21. A method for weighting a SAW interdigital transducer having a plurality of interdigitized electrode fingers, said method comprising providing at least one internal surface edge of at least one interdigitized electrode finger with a shape defining a ratio between its width and its arrangement-periodicity, and also defining variable spacing between each of said fingers, such that said ratio varies substantially along each of said fingers, said variable ratio inducing SAW reflection coefficient dispersion along said fingers, thereby providing a weighting mechanism to control weighting coefficients for achieving desired frequency characteristics of the IDT.

22. A method for controlling the diffraction spreading of SAW beams in a SAW interdigital transducer having a plurality of interdigitized electrode fingers, using the SAW velocity dispersion effect comprising providing at least one internal surface edge of at least one interdigitized electrode finger with a shape defining a ratio between its width and its arrangement-periodicity, and also defining variable spacing between each of said fingers, such that said ratio varies substantially along each of said fingers, said variable ratio inducing SAW velocity dispersion along said fingers, thereby providing a mechanism to control the diffraction spreading for achieving desired frequency characteristics of the IDT.

23. A SAW interdigital transducer having a plurality of interdigitized electrode fingers, said transducer being weighted by having at least one internal surface edge of at least one of said interdigitized electrode fingers having a shape defining a ratio between its width and its arrangement-periodicity, and also defining variable spacing between each of said fingers, such that said ratio varies substantially along each of said fingers, said variable ratio inducing dispersion of both SAW velocity and SAW reflection coefficient along said fingers, thereby providing a weighting mechanism to control weighting coefficients for achieving desired frequency characteristics of the IDT.

* * * * *